United States Patent
Konno et al.

(10) Patent No.: US 8,445,906 B2
(45) Date of Patent: May 21, 2013

(54) METHOD FOR SORTING AND ACQUIRING SEMICONDUCTOR ELEMENT, METHOD FOR PRODUCING SEMICONDUCTOR DEVICE, AND SEMICONDUCTOR DEVICE

(75) Inventors: Yoshito Konno, Kawasaki (JP); Yutaka Yamada, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 678 days.

(21) Appl. No.: 12/690,198

(22) Filed: Jan. 20, 2010

(65) Prior Publication Data

US 2010/0117084 A1  May 13, 2010

Related U.S. Application Data

(63) Continuation of application No. PCT/JP2007/065784, filed on Aug. 10, 2007.

(51) Int. Cl.
*H01L 23/58* (2006.01)

(52) U.S. Cl.
USPC ............... 257/48; 257/E21.529; 257/E23.01; 438/7; 438/10; 438/12; 438/13; 438/14

(58) Field of Classification Search
USPC ............. 257/48, E21.529, E23.01; 438/7–18
See application file for complete search history.

(56) References Cited

U.S. PATENT DOCUMENTS

| | | | | |
|---|---|---|---|---|
| 5,917,332 | A * | 6/1999 | Chen et al. | 324/750.02 |
| 6,218,199 | B1 * | 4/2001 | Sato | 438/14 |
| 6,462,538 | B2 * | 10/2002 | Harada | 324/224 |
| 6,547,902 | B2 | 4/2003 | Arai et al. | |
| 6,600,171 | B1 * | 7/2003 | Farnworth et al. | 257/48 |
| 6,682,948 | B2 * | 1/2004 | Wada | 438/17 |
| 6,760,472 | B1 * | 7/2004 | Takeda et al. | 382/149 |
| 7,112,889 | B1 * | 9/2006 | Maruyama et al. | 257/797 |
| 7,482,699 | B2 * | 1/2009 | Sasaki et al. | 257/784 |
| 7,683,483 | B2 * | 3/2010 | Secareanu et al. | 257/737 |
| 7,932,613 | B2 * | 4/2011 | Child | 257/779 |
| 2001/0004002 | A1 | 6/2001 | Arai et al. | |
| 2004/0238973 | A1 * | 12/2004 | Wakisaka et al. | 257/796 |

(Continued)

FOREIGN PATENT DOCUMENTS

| | | |
|---|---|---|
| JP | 57-95644 | 6/1982 |
| JP | 60-246645 | 12/1985 |

(Continued)

OTHER PUBLICATIONS

International Search Report of PCT/JP2007/065784, mailing date of Nov. 6, 2007.

*Primary Examiner* — N Drew Richards
*Assistant Examiner* — Ankush Singal
(74) *Attorney, Agent, or Firm* — Westerman, Hattori, Daniels & Adrian, LLP

(57) ABSTRACT

A method for sorting and acquiring a semiconductor element, including: disposing a plurality of semiconductor elements in an effective section in a semiconductor substrate; disposing a standard semiconductor element outside of the effective section in the semiconductor substrate; forming a bump in each of the plurality of the semiconductor elements and in the standard semiconductor element; performing a test on the plurality of the semiconductor elements in the effective section; forming a location map using the standard semiconductor element as a base point; and picking up the semiconductor elements determined as non-defective in the test from the plurality of the semiconductor elements based on the location map.

8 Claims, 14 Drawing Sheets

U.S. PATENT DOCUMENTS

| | | | |
|---|---|---|---|
| 2006/0079009 A1* | 4/2006 | Salmon et al. | 438/14 |
| 2006/0262253 A1* | 11/2006 | Teramoto et al. | 349/110 |
| 2008/0108221 A1* | 5/2008 | Kim et al. | 438/652 |
| 2008/0318346 A1* | 12/2008 | Maki et al. | 438/7 |

FOREIGN PATENT DOCUMENTS

| | | |
|---|---|---|
| JP | 3-196633 | 8/1991 |
| JP | 5-121496 | 5/1993 |
| JP | 2000-77487 | 3/2000 |
| JP | 2001-144197 | 5/2001 |
| JP | 2001-176892 | 6/2001 |
| JP | 2002-184819 | 6/2002 |
| JP | 2003-273052 | 9/2003 |
| JP | 2004-349611 | 12/2004 |

\* cited by examiner

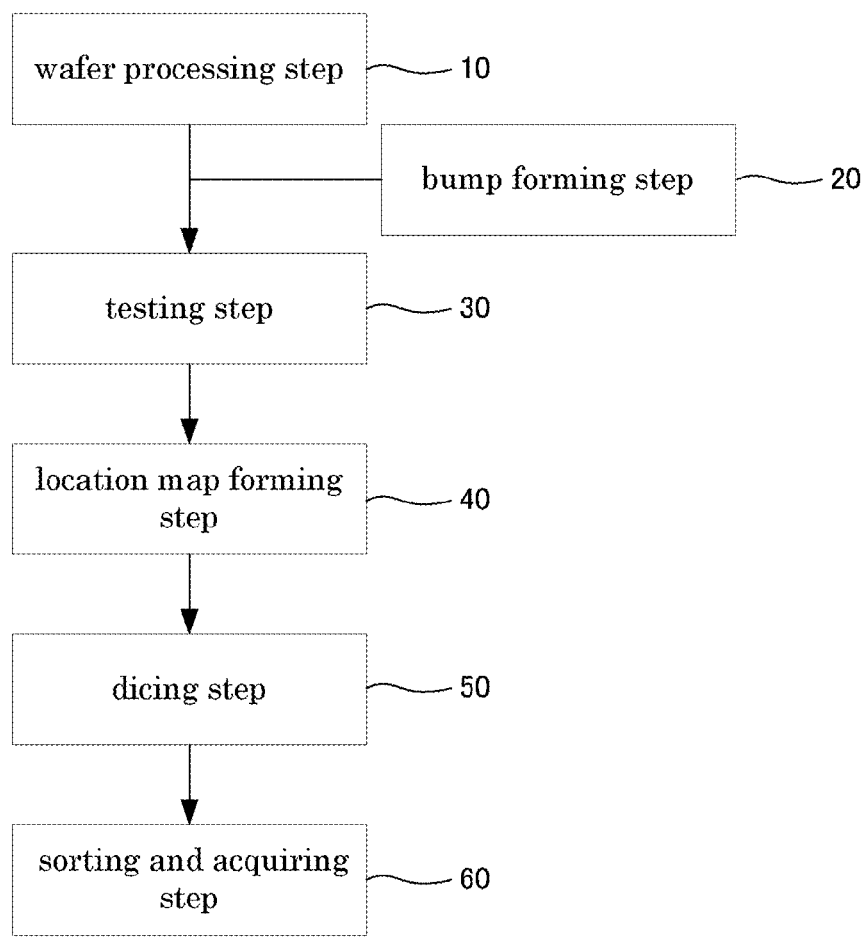
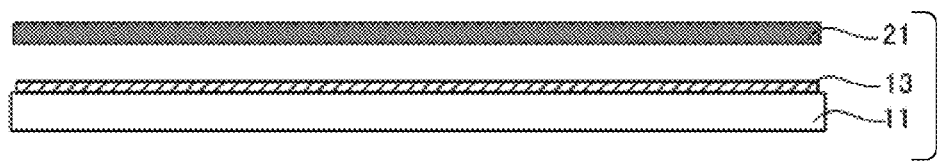

Related Art

Related Art

Related Art

METHOD FOR SORTING AND ACQUIRING SEMICONDUCTOR ELEMENT, METHOD FOR PRODUCING SEMICONDUCTOR DEVICE, AND SEMICONDUCTOR DEVICE

CROSS-REFERENCE TO RELATED APPLICATIONS

This application is a continuation of PCT/JP2007/065784, and based upon and claims the benefit of priority of the prior International Patent Application No. PCT/JP2007/065784, filed on Aug. 10, 2007, the entire contents of which are incorporated herein by reference.

FIELD

The embodiments discussed herein are related to a method for sorting and acquiring a semiconductor element, which picks up a defect-free (non-defective) semiconductor element from a plurality of semiconductor elements (semiconductor chips) formed in a semiconductor substrate (semiconductor wafer), and a method for producing a semiconductor device, and a semiconductor device.

BACKGROUND

Recently, in order to achieve mass production and lower production cost in production of semiconductor devices, it is desired to obtain as many semiconductor elements (semiconductor chips) as possible from a semiconductor substrate (semiconductor wafer). Thus, depending on the types and sizes of semiconductor elements, several thousand semiconductor elements or more are obtained from a semiconductor substrate.

On the other hand, according to reduction in size and weight of electronic devices in which the semiconductor devices are mounted, it is attempting to reduce thickness and weight of packages (cases) housing the semiconductor elements, and to narrow pitches of terminals. Thus, a bump connection method is proposed to connect a semiconductor element with a circuit board on which the semiconductor element is mounted, instead of a conventional wire connection method.

FIG. 12A depicts a state in which a plurality of semiconductor elements are formed in a surface of a semiconductor substrate. In FIG. 12A, a rectangle represents a semiconductor element 1A. Moreover, a cross section A-A' of a semiconductor substrate 1 is depicted in 12B.

Namely, a plurality of bumps 3 are arranged through a multilayer wiring layer or rewiring layer 2 in each of the semiconductor element 1A formed in the surface of the semiconductor substrate 1.

Then, semiconductor elements 1A are individually subjected to an electric test so as to detect a non-defective or a defective before singulated from the semiconductor substrate 1, i.e., the semiconductor substrate 1 is diced and the semiconductor elements 1A are separated into single pieces.

As depicted in FIG. 12C, the electric test is performed in such a manner that a test probe 4 is brought into contact with the bump 3 which is a terminal for external connection in each of the semiconductor elements 1A. That is, as depicted in FIG. 12D, a plurality of the semiconductor elements 1A formed in an effective section (a section surrounded by a dashed line circle, ES) in the semiconductor substrate 1 are subjected to the electric test using a test device (not depicted) which is connected to the test probe, so as to detect a defective semiconductor element.

From a result of the detection, an existence state of defectives (generally, called as "map data") is obtained. The existence state of defectives is represented by map information 21 as depicted in FIG. 12E. In the map data, a rectangle represents a semiconductor element, and a rectangle with "x" represents a defective semiconductor element.

As depicted in FIG. 12F, the semiconductor substrate 1, of which map information is obtained, is placed on a dicing tape 5, and then singulated into each of the semiconductor elements by a dicing method or the like using a dicing blade 6.

A cross section of the semiconductor substrate 1 which has been subjected to the dicing process is depicted in FIG. 12G.

Thereafter, as depicted in FIG. 12H, from a back surface of the dicing tape 5 (a surface on which the semiconductor substrate 1 is not placed), each of the semiconductor element 1A is pushed up by a push-up pin 7 and adsorbed to an adsorption collet 8, so as to be picked up. At this time, the defective semiconductor element is not picked up according to the map data. Then, the picked up non-defective (defect-free) semiconductor element 1A is sent to a next step, for example, while it is housed in a case (tray) for a semiconductor element (not depicted).

Meanwhile, it is not easy to efficiently pick up the non-defective (defect-free) semiconductor element according to the map data. In the semiconductor substrate 1, a layout is selected to form as many semiconductor elements 1A as possible in the largest section, from which the semiconductor elements 1A are obtained, in order to improve efficiency of picking up the semiconductor element 1A. In the semiconductor substrate which has been subjected to the dicing process, all the semiconductor elements 1A appear the same. Thus, location information of the non-defective semiconductor element in the map data may be precisely matched (overlapped) to location information of a great number of the semiconductor elements, so that the non-defective (defect-free) semiconductor elements are picked up from the semiconductor elements having similar appearances.

However, the semiconductor substrate 1 is not marked, and thus, it is difficult to precisely overlap the map data to the semiconductor substrate, which has been subjected to dicing. As one of methods for the precise overlapping, conventionally, a method for matching a distance datum from the center of a semiconductor substrate with a distance datum in map data has been proposed. However, in the case of this method, a problem occurs that a distance datum does not match with a distance in the semiconductor substrate 1 due to a shift error of an equipment used for sorting and acquiring the semiconductor element, and deformation of the dicing tape 5 caused by dicing the semiconductor substrate. Therefore, as a final solution, the alignment has been confirmed by visual inspection.

It is difficult to precisely operate the alignment by visual inspection, and a position of a first semiconductor element of the map data may be misplaced. As a result, there is a high possibility that the defective semiconductor element is falsely recognized. The false recognition of the defective semiconductor element is mostly detected by a test which is performed after a semiconductor device has been assembled. This causes unnecessary loss of a wiring substrate, on which the semiconductor element is mounted, etc., and delay in the production of the semiconductor devices and electronic devices.

Therefore, a method for avoiding the false recognition of the position of the first semiconductor element of the map data or a method for detecting the false recognition are desired. Consequently, a method is proposed that an ink mark is formed in a pellet which is present outside of an effective section in a semiconductor substrate, and a non-defective or defective determination test is performed by a coordinate system using the ink mark as a base point, thereby forming the ink mark in a detected defective (for example, Japanese Laid-open Patent Publication No. 2002-184819).

However, in the ink mark method, the ink mark is not formed on a small semiconductor element or a semiconductor element in which a bump is formed, and moreover the ink needs to be controlled. Moreover, in the case of a method, in which a non-defective (defective-free) semiconductor element is obtained by using map data, the method is only effective when the ink mark is formed on a semiconductor element in a semiconductor substrate according to test results. The method is not employed to a semiconductor substrate, on which a test without using the ink mark is performed.

On the other hand, a method is proposed that a semiconductor element having a certain circuit pattern which is different from a typical one is formed in a certain point of a semiconductor substrate, and the semiconductor element is detected by a test, and then map data is formed using the semiconductor element as a base point (for example, Japanese Laid-open Patent Publication No. 57-95644).

According to such method, a section for forming the semiconductor element having a certain circuit pattern which is different from a typical one is formed on the semiconductor substrate. Moreover, as the semiconductor element having a certain circuit pattern which is different from a typical one is different from other typical semiconductor elements, it is not used as a product. Furthermore, on a large semiconductor substrate, a photomask including a pattern of the semiconductor element having a certain circuit pattern which is different from a typical one and a pattern of a semiconductor element to be formed into a product is repeatedly applied on a semiconductor substrate, so as to produce a circuit pattern of the semiconductor element. Therefore, the semiconductor elements each having a certain circuit pattern which is different from that of the semiconductor element to be formed into a product are formed as many as shot numbers, causing decrease in a percentage of acquiring the semiconductor element to be formed into a product. In order to avoid the decrease of the percentage, a mask for the semiconductor element having a certain circuit pattern which is different from that of the semiconductor element to be formed into a product, and a mask for the product are provided, increasing of production cost.

SUMMARY

According to an aspect of embodiments, a method for sorting and acquiring a semiconductor element, including: disposing a plurality of semiconductor elements in an effective section in a semiconductor substrate; disposing a standard semiconductor element outside of the effective section in the semiconductor substrate; forming a bump in each of the plurality of the semiconductor elements and in the standard semiconductor element; performing a test on the plurality of the semiconductor elements in the effective section; forming a location map using the standard semiconductor element as a base point; and picking up the semiconductor elements determined as non-defective in the test from the plurality of the semiconductor elements based on the location map.

According to another aspect of embodiments, a method for producing a semiconductor device, including disposing a plurality of semiconductor elements in an effective section in a semiconductor substrate; disposing a standard semiconductor element outside of the effective section in the semiconductor substrate; forming a bump in each of the plurality of the semiconductor elements and in the standard semiconductor element; performing a test on the plurality of the semiconductor elements in the effective section; forming a location map using the standard semiconductor element as a base point; picking up the semiconductor elements determined as non-defective in the test from the plurality of the semiconductor elements based on the location map; and producing a semiconductor device using the semiconductor elements determined as non-defective.

According to another aspect of embodiments, a semiconductor device including: a plurality of semiconductor element segments formed in an effective section in a semiconductor substrate; and a plurality of semiconductor element segments outside of the effective section, formed in a section outside of and surrounding the effective section in the semiconductor substrate, wherein a plurality of first projecting electrodes arranged substantially in a lattice-shape are formed in each of the plurality of the semiconductor element segments, and a second projecting electrode is formed in the plurality of the semiconductor element segments outside of the effective section, and the number of the second projecting electrode is less than the number of the first projecting electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a flow chart depicting an example of a method for sorting and acquiring a semiconductor element;

FIG. 2A is a process drawing depicting an example of a bump forming step (first);

DESCRIPTION OF EMBODIMENTS

EXAMPLE 1

Example 1 of a method for sorting and acquiring a defect-free semiconductor element of the invention will be explained with reference to drawings. FIG. 1 is a flow chart depicting a step of sorting and acquiring a semiconductor element in Example 1.

In Example 1, in a wafer processing step 10, a plurality of semiconductor elements are formed on a surface of a semiconductor substrate (semiconductor wafer). Next, as a terminal for external connection, a projecting electrode (bump) is formed in each of the semiconductor elements formed on the semiconductor substrate (a bump forming step 20). At this time, an identification bump is provided in at least one semiconductor element formed outside of an effective section in the semiconductor substrate. The semiconductor element provided with the identification bump is used as a standard semiconductor element. Next, using a test probe, an electric test is performed on each of the semiconductor elements formed in the semiconductor substrate so as to detect and determine a non-defective (defect-free) or a defective (a testing step 30). Next, based on a result of the test, a location map is formed using the standard semiconductor element as a base point, in which the map includes positions of the defect-free (non-defective) semiconductor element and the defective semiconductor element in a plurality of the semiconductor elements formed in the effective section in the semiconductor substrate (a location map forming step 40). Next, the semiconductor substrate is subjected to a dicing process so that the semiconductor elements formed in the semiconductor substrate are singulated, i.e., separate into single pieces. (a dicing step 50). Thereafter, according to the location map, the defect-free (non-defective) semiconductor element is selectively picked up (a sorting and acquiring step 60).

Namely, in the wafer processing step 10, a plurality of semiconductor element (semiconductor chip) segments, each of which includes an electronic circuit formed of an active element such as MIS transistor or the like, a passive element such as capacitative element or the like, and a wiring layer, are formed in a surface of a semiconductor substrate 11 formed of silicon (Si) or gallium arsenide (GaAs). An electrode terminal pad 12 connected to the electronic circuit is provided on the surface of each semiconductor element.

Figure 2B:
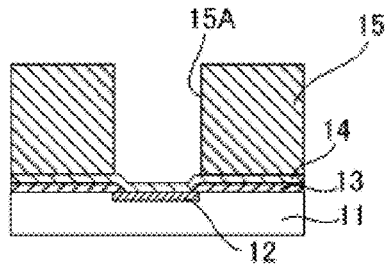
FIG. 2B is a process drawing depicting an example of the bump forming step (second)

On the electrode terminal pad 12, as the terminal for external connection a substantially spherical bump is formed by the following method in the bump forming step 20. That is, a photoresist layer 15 is formed over the semiconductor substrate 11 in which a plurality of semiconductor element (semiconductor chip) segments are formed. The photoresist layer 15 is subjected to selective exposure process using a mask 21 so as to selectively form an opening in the photoresist layer 15 over the electrode terminal pad 12 in the semiconductor element segment (see FIG. 2A). In FIG. 2A, on the insulation layer 13 a metal layer 14 (not depicted) is provided beforehand.

Over the electrode terminal pad 12 in each of the semiconductor element segment, a metal layer 14 has been provided beforehand on the insulation layer 13, with which the semiconductor substrate 11 is coated around the electrode terminal pad 12. The insulation layer 13 and the metal layer 14 constitute a multilayer wiring layer or a rewiring layer. In the photoresist layer 15, an opening 15A is formed correspondingly above the electrode terminal pad 12 (see FIG. 2B).

Figure 2C:
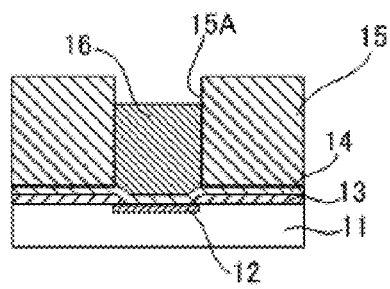
FIG. 2C is a process drawing depicting an example of the bump forming step (third)

Then, electroplating is performed on a part to be processed with the metal layer 14 serving as an electrode so as to deposit and fill in the opening 15A a metal 16 for bump formation, such as a solder material (see FIG. 2C).

Figure 2D:
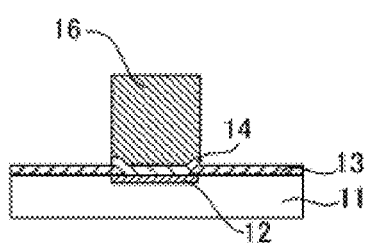
FIG. 2D is a process drawing depicting an example of the bump forming step (fourth)
Figure 2E:
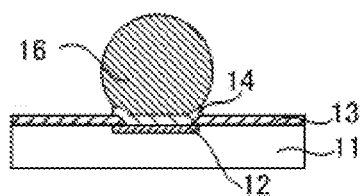
FIG. 2E is a process drawing depicting an example of the bump forming step (fifth)

Next, the photoresist layer 15 is removed, and then the metal layer 14 is selectively removed with the metal 16 for bump formation serving as a mask (see FIG. 2D). Thereafter, the metal 16 for bump formation is heated and melted to be formed into a substantially spherical shape (see FIG. 2E).

Figure 3A:
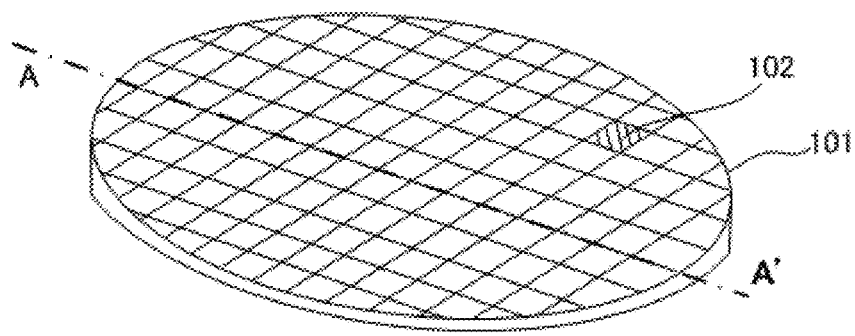
FIG. 3A is a perspective view of a semiconductor substrate in which a great number of bumps are formed.
Figure 3B:
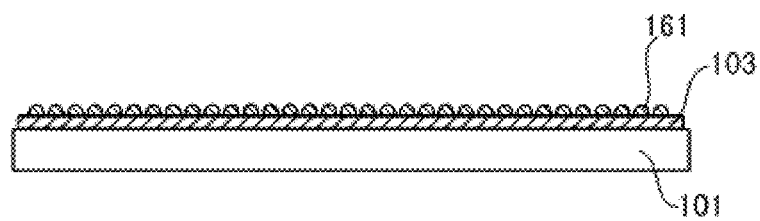
FIG. 3B is a cross sectional view A-A' of FIG. 3A.

As described above, a semiconductor substrate 101 including a plurality of semiconductor elements in which a bump 161 is arranged in each of the electrode terminal pads, is depicted in FIG. 3A. In FIG. 3A, a rectangle 102 represents a semiconductor element. Moreover, a cross section A-A' of the semiconductor substrate 101 is depicted in FIG. 3B. In FIG. 3B, 103 denotes a multilayer wiring layer or a rewiring layer, and 161 denotes a bump.

Then, the semiconductor elements 102 in the semiconductor substrate 101 are individually subjected to an electric test before the semiconductor substrate 101 is diced so as to separate the semiconductor elements 102 into single pieces of the semiconductor elements, so as to detect a non-defective or a defective.

Figure 3C:
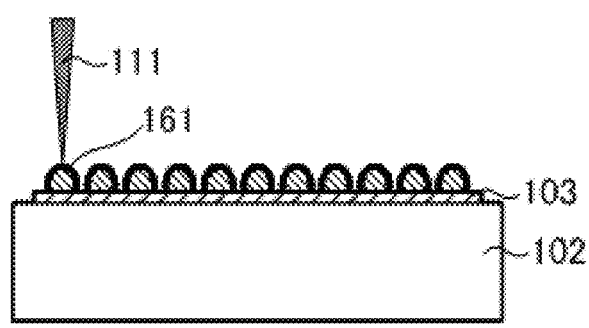
FIG. 3C is a schematic explanatory view depicting an example of a testing step.
Figure 3D:
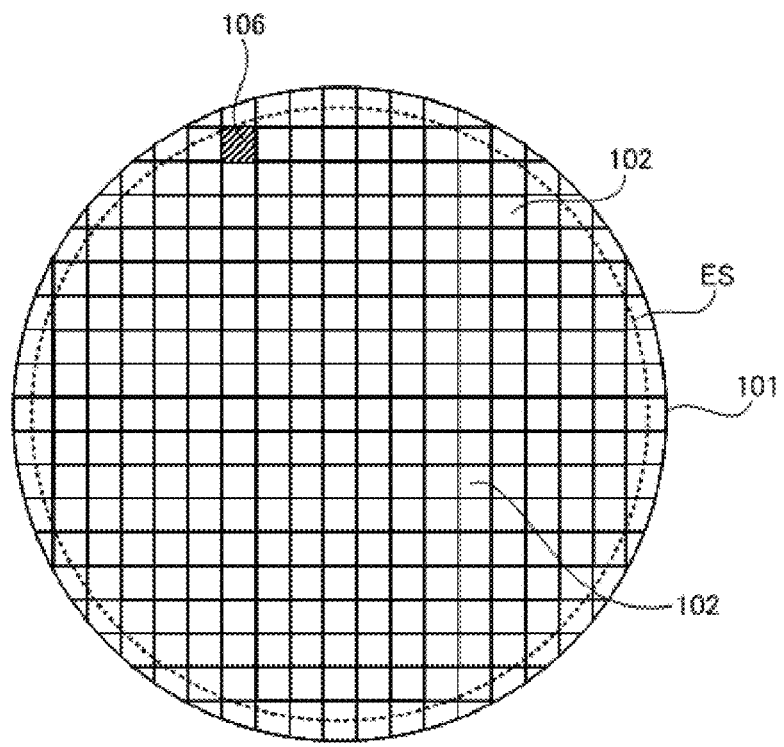
FIG. 3D is a schematic explanatory view depicting a position of a semiconductor element in an effective section in a semiconductor substrate.

The electric test is performed in such a manner that a test probe 111 is brought into contact with the bump 161 in each of the semiconductor elements 102 as depicted in FIG. 3C. That is, as depicted in FIG. 3D, a plurality of semiconductor elements 102 formed in an effective section (a section surrounded by a dashed line circle ES) in the semiconductor substrate 101 are subjected to the electric test using a test device (not depicted) which is connected to the test probe 111, so as to detect a non-defective or a defective.

Figure 3E:
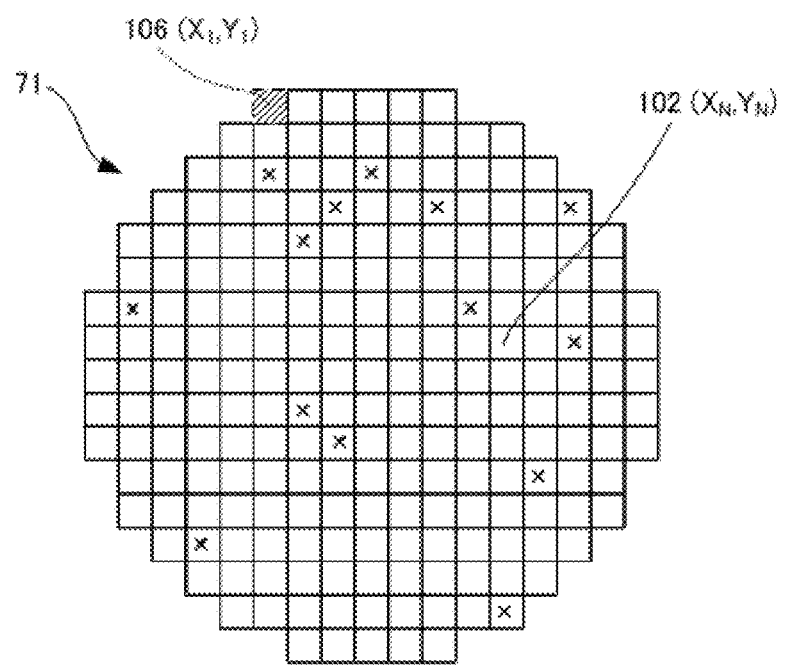
FIG. 3E is map data depicting positions of a standard semiconductor element, non-defective (defect-free) semiconductor elements and defective semiconductor elements according to location information depicted in FIG. 3D.

From a result of the detection, a existence state of defectives (generally, also called as "map data") is obtained. The existence state of defectives is represented by map information as depicted in FIG. 3E. In the map data 71, a rectangle represents a semiconductor element, and a rectangle with "x" represents a defective semiconductor element.

Figure 4A:
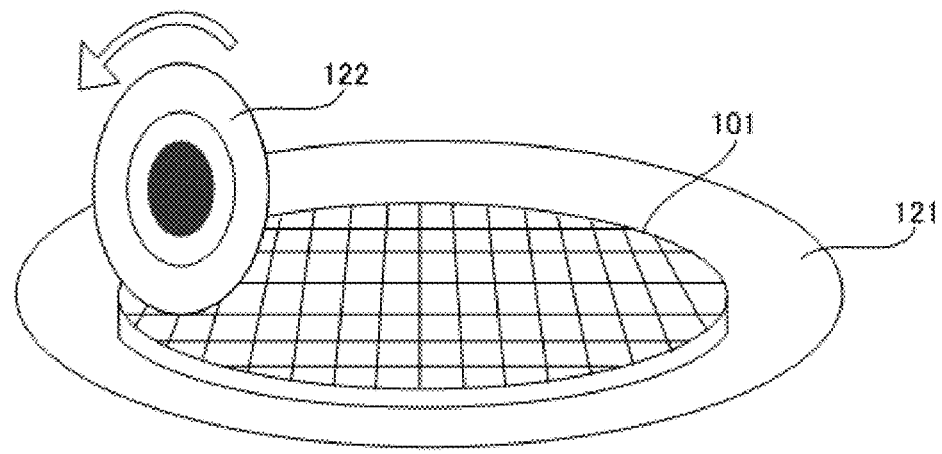
FIG. 4A is a schematic explanatory view depicting an example of a dicing step.
Figure 4B:
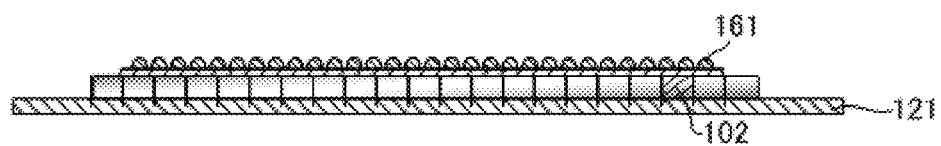
FIG. 4B is a schematic cross sectional view depicting a state in which a semiconductor substrate has been subjected to the dicing step.

As depicted in FIG. 4A, the semiconductor substrate 101, of which map data 71 are obtained, is placed on a dicing tape 121, and then cut and separated by a dicing blade 122 so as to be singulated into each of the semiconductor elements 102. A cross section of the semiconductor substrate 101 which has been subjected to the dicing process is depicted in FIG. 4B.

Figure 4C:
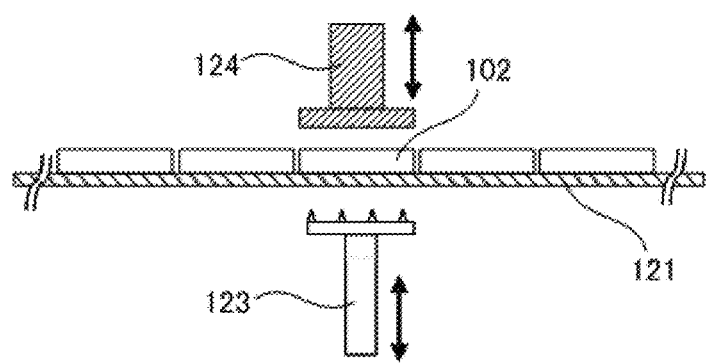
FIG. 4C is a schematic explanatory view depicting an example of a step of acquiring only the non-defective (defect-free) semiconductor elements according to the map data.

Thereafter, as depicted in FIG. 4C, from a back surface of the dicing tape 121 (a surface on which the semiconductor substrate 101 is not placed), the semiconductor element 102 is pushed up by a push-up pin 123 and adsorbed to a adsorption collet 124, so as to be picked up. At this time, a defective semiconductor element is not picked up according to the map data 71. Then, the picked up non-defective (defect-free) semiconductor element 102 is sent to a next step, for example, while it is housed in a case (tray) for a semiconductor element (not depicted).

Example 1, in the production, testing, and pick-up steps of such semiconductor element, is characterized by an arrangement structure of the bumps in at least one of semiconductor elements 106, each of which is partly located in the effective section (the section surrounded by a dashed line circle ES) but which is partly located outside of the effective section in the semiconductor substrate, i.e., semiconductor elements for non-product use (semiconductor chips for non-product use), and by a use embodiment of the semiconductor elements for non-product use (semiconductor chips for non-product use).

Figure 5A:
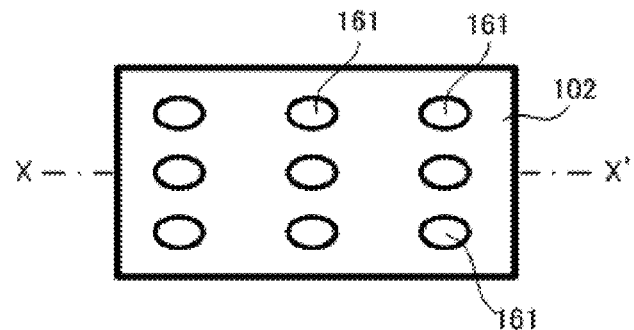
FIG. 5A is a schematic view depicting an example of an arrangement pattern of bumps in a semiconductor chip product.
Figure 5B:
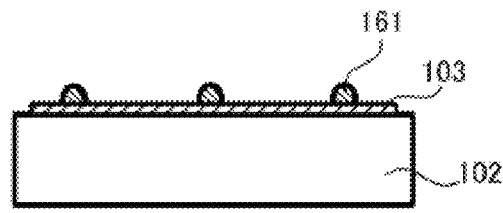
FIG. 5B is a cross sectional view X-X' of FIG. 5A.

That is, in the bump forming step 20, in the semiconductor element (semiconductor chip product) 102 which is located in the effective section and formed into a product, for example, as depicted in FIGS. 5A and 5B, a plurality of bumps 161 are arranged, for example, in a lattice pattern through a multilayer wiring layer or rewiring layer 103 over a surface of the semiconductor element 102 in the bump forming step 20. FIG. 5A depicts a flat surface of the semiconductor element (semiconductor chip product) and FIG. 5B depicts a cross sectional view X-X' of FIG. 5A.

On the other hand, as depicted in FIGS. 6A and 6B or FIGS. 7A and 7B, an arrangement structure of bumps 261 in the semiconductor element for non-product use (semiconductor chip for non-product use) 106 is different from that of the bumps in the semiconductor element to be produced (semiconductor chip product) 102.

That is, the arrangement of the bumps 261 in the semiconductor element for non-product use (semiconductor chip for non-product use) 106 are characteristic, in which the bumps 261 are arranged in four corners and the central part of the semiconductor element 106, or only in centers of four sides of the semiconductor element 106, respectively as depicted in FIGS. 6A and 6B or FIGS. 7A and 7B. Thus, the arrangement structure of the bumps 261 in the semiconductor element for non-product use (semiconductor chip for non-product use) 106 is different from that of the bumps in the semiconductor element to be produced (semiconductor chip product) 102. The bumps 261 in the semiconductor element for non-product use (semiconductor chip for non-product use) 106 are limited in its number and selectively provided on the semiconductor element 106. Thus, the arrangement of the bumps 261 is different from that of the bumps in the semiconductor element to be produced (semiconductor chip product) 102, and each of the bumps 261 can be easily recognized by image recognition, and can be used as an identification bump.

Figure 6A:
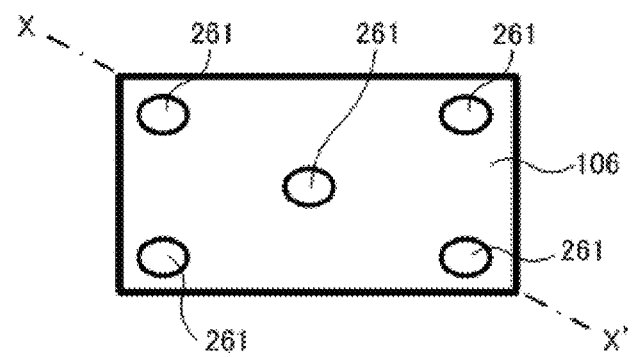
FIG. 6A is a schematic view depicting an example of an arrangement pattern of bumps in a semiconductor chip for non-product use (first)
Figure 6B:
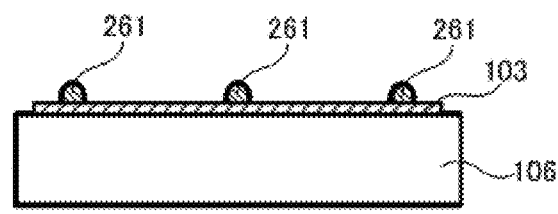
FIG. 6B is a cross sectional view X-X' of FIG. 6A.
Figure 7A:
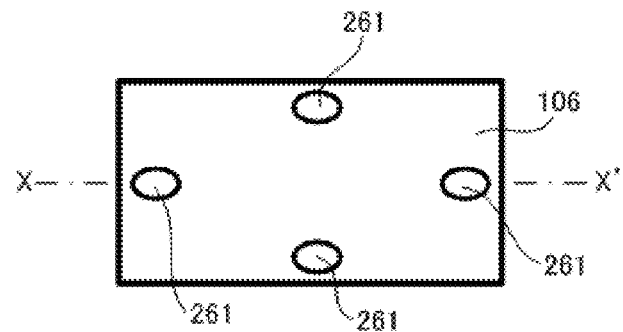
FIG. 7A is a schematic view depicting an example of an arrangement pattern of bumps in the semiconductor chip for non-product use (second)
Figure 7B:
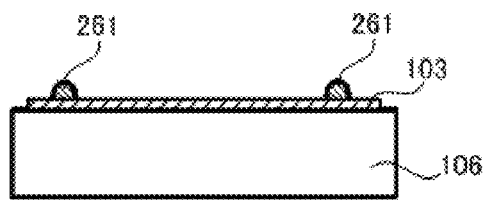
FIG. 7B is a cross sectional view X-X' of FIG. 7A.

In the semiconductor element for non-product use (semiconductor chip for non-product use) 106 depicted in FIG. 6A and FIG. 6B, the bumps 261 are provided in four corners and the central part of the semiconductor element 106. Moreover, in the semiconductor element for non-product use (semiconductor chip for non-product use) 106 depicted in FIG. 7A and FIG. 7B, the bumps 261 are provided in substantially centers of four sides of the semiconductor element 106. All of the arrangement structures of these bumps are different from that of the bumps in the semiconductor element to be produced (semiconductor chip product) 102 depicted in FIG. 5A and 5B.

Then, in the testing step 30, when the semiconductor elements formed in the semiconductor substrate 101 are individually subjected to the electric test so as to detect and determine a non-defective or a defective, location information of the semiconductor element for non-product use (semiconductor chip for non-product use) 106 is taken and included in the map data. At this time, the semiconductor element for non-product use (semiconductor chip for non-product use) 106 has the arrangement structure of the bumps different from that of the bumps in the semiconductor element to be produced (semiconductor chip product) 102 in the effective section. Thus, the position of the semiconductor element for non-product use (semiconductor chip for non-product use) 106 is fairly easily recognized, and the semiconductor element for non-product use (semiconductor chip for non-product use) 106 is effectively used as the standard semiconductor element.

Therefore, in the location map forming step 40, using the standard semiconductor element 106 as a base point (starting point), map data 71 of the non-defective semiconductor element and the defective semiconductor element in a plurality of the semiconductor elements 102 formed in the effective section in the semiconductor substrate 101 can be fairly easily produced.

That is, as depicted in FIG. 3D, according to the arrangement of the semiconductor element products 102 in the effective section and the arrangement of the standard semiconductor element 106 located outside of the effective section in the semiconductor substrate 101, as depicted in FIG. 3E, using the standard semiconductor element 106 as a base point (for example, $X_1$, $Y_1$ of the coordinate axis), the map data 71 is obtained, which is formed as location map information indicating whether each of the semiconductor element products 102 positioned in a certain position $(X_N, Y_N)$ of the semiconductor substrate 101 is non-defective (defect-free) or defective. In the map data 71, a point marked with "x" represents an existing position of the semiconductor element product 101 which is defective. The location map information includes location information of the non-defective semiconductor element and the defective semiconductor element using the position of the standard semiconductor element 106 as a base point (starting point).

Then, in the sorting and acquiring step 60, the non-defective semiconductor element is picked up from a plurality of semiconductor elements 102, which are obtained by singulating the semiconductor substrate in the dicing step 50, according to the map data 71 obtained in the location map forming step 40, i.e., the data 71 in which the exiting position of the non-defective (defect-free) semiconductor elements and the defective semiconductor elements are mapped (see FIG. 3E) based on the determination result (determination result of the testing step 30).

Figure 8:
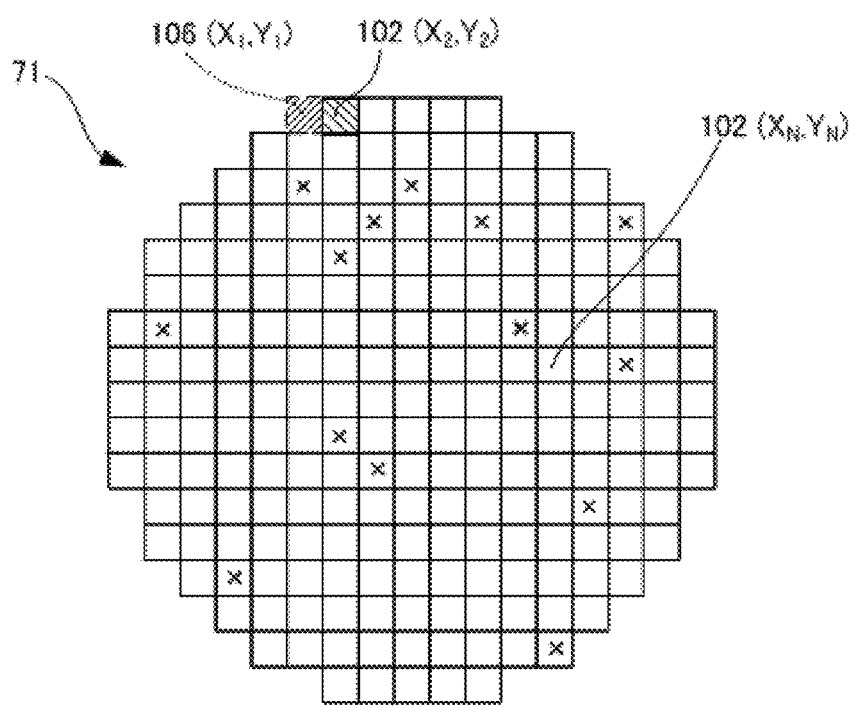
FIG. 8 is a schematic explanatory view depicting location information of a semiconductor element product which is firstly picked up in map data.

FIG. 8 depicts location information of the semiconductor element product 102 which is firstly picked up in the map data 71 depicted in FIG. 3E. In the sorting and acquiring step 60, when the semiconductor element which is firstly picked up in the semiconductor substrate 101 is determined according to the map data 71, an image pattern of a bump of the standard semiconductor element 106, a coordinate datum $(X_1, Y_1)$ of the standard semiconductor element 106 from the center of the semiconductor substrate on the design, and a coordinate datum $(X_2, Y_2)$ of the first picked up semiconductor element in the map data 71 from the center of the semiconductor substrate on the design are registered beforehand. Next, the coordinate of the center position $(X_0, Y_0)$ of the semiconductor substrate 101 is calculated. Then, a position of the standard semiconductor element is identified from the coordinate of the center position $(X_0, Y_0)$ of the semiconductor substrate 101 to be processed, and the coordinate datum $(X_1, Y_1)$ from the center of the semiconductor substrate on the design which has been registered beforehand, and then the semiconductor element is subjected to image recognition to determine it as the standard semiconductor element 106. Next, with the position of the standard semiconductor element 106 as the standard position, the position of the semiconductor element 102 which is firstly picked up is determined from the $(X_1, Y_1)$ datum and the $(X_2, Y_2)$ datum. A series of these processes is automatically performed, so as to improve reliability of aligning each of the positions of a great number of the semiconductor elements 102 obtained by dicing the semiconductor substrate 101 with a position in the map data 71.

In Example 1, when the semiconductor element which is firstly picked up in the semiconductor substrate 101 is checked and confirmed according to the map data 71, the standard semiconductor element 106 having the identification bump is positioned outside of the effective section in the semiconductor substrate 101, so that the position of the semiconductor element which is started to be picked up is identified, with the standard semiconductor element 106 as a standard position. Therefore, the reliability is high in the alignment of the semiconductor substrate 101 with the map data 71, and the non-defective (defect-free) semiconductor element can be certainly sorted and acquired. Therefore, in the production of the semiconductor device, the semiconductor device is not produced using the defective semiconductor element, thereby increasing production yield and reliability of the semiconductor device.

EXAMPLE 2

Example 2 of a method for sorting and acquiring a defect-free chip of the invention will be explained with reference to drawings.

In Example 2, a plurality of semiconductor elements, which are partly located in an effective section (a section surrounded by a dashed line circle ES), but which are partly located outside of the effective section in a semiconductor substrate are used, and an identification bump 261 is provided in each of the semiconductor elements. Example 2 is characterized by an arrangement structure of the bumps in a plurality of the semiconductor elements for non-product use (semiconductor chips for non-product use), and by a use embodiment of a plurality of the semiconductor elements for non-product use (semiconductor chips for non-product use).

Figure 9A:
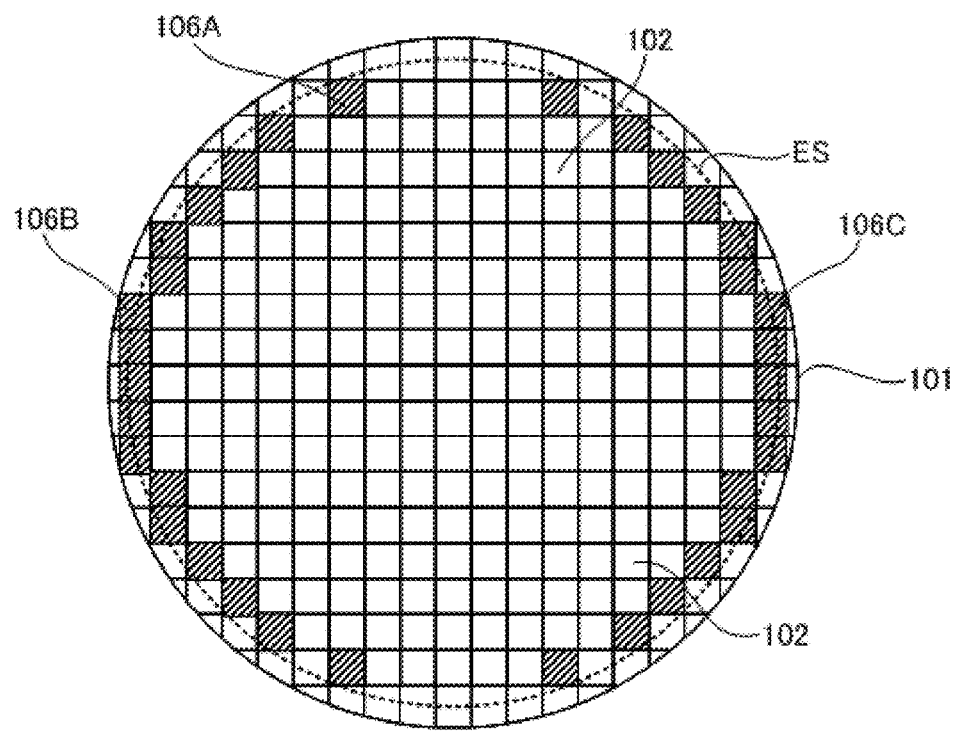
FIG. 9A is a schematic explanatory view depicting positions of semiconductor elements in an effective section and a great number of standard semiconductor elements provided in the boundary of the effective section in a semiconductor substrate.

That is, a plurality of semiconductor elements (semiconductor chips for non-product use) 106A, 106B, 106C, which are partly located in the effective section (the section surrounded by a dashed line circle ES), but which are partly located outside of the effective section in a semiconductor substrate 101 as depicted in FIG. 9A, have arrangement structures of bumps depicted in FIG. 6A and 6B or FIG. 7A and 7B. Namely, in Example 2, a plurality of standard semiconductor elements are arranged in one semiconductor substrate 101.

Then, in the testing step 30, when the semiconductor elements formed in the semiconductor substrate 101 are individually subjected to the electric test so as to detect and determine a non-defective or a defective, location information of the semiconductor elements for non-product use (semiconductor chips for non-product use) 106A, 106B, and 106C is taken and included in the map data. At this time, each the semiconductor element for non-product use (semiconductor chip for non-product use) has the arrangement structure of the bumps different from that of the bumps in the semiconductor element to be produced (semiconductor chip product) in the effective section. Thus, the position of the semiconductor element for non-product use (semiconductor element for non-product use) 106 is fairly easily recognized, and the semiconductor element for non-product use (semiconductor element for non-product use) 106 is effectively used as the standard semiconductor element.

Figure 9B:
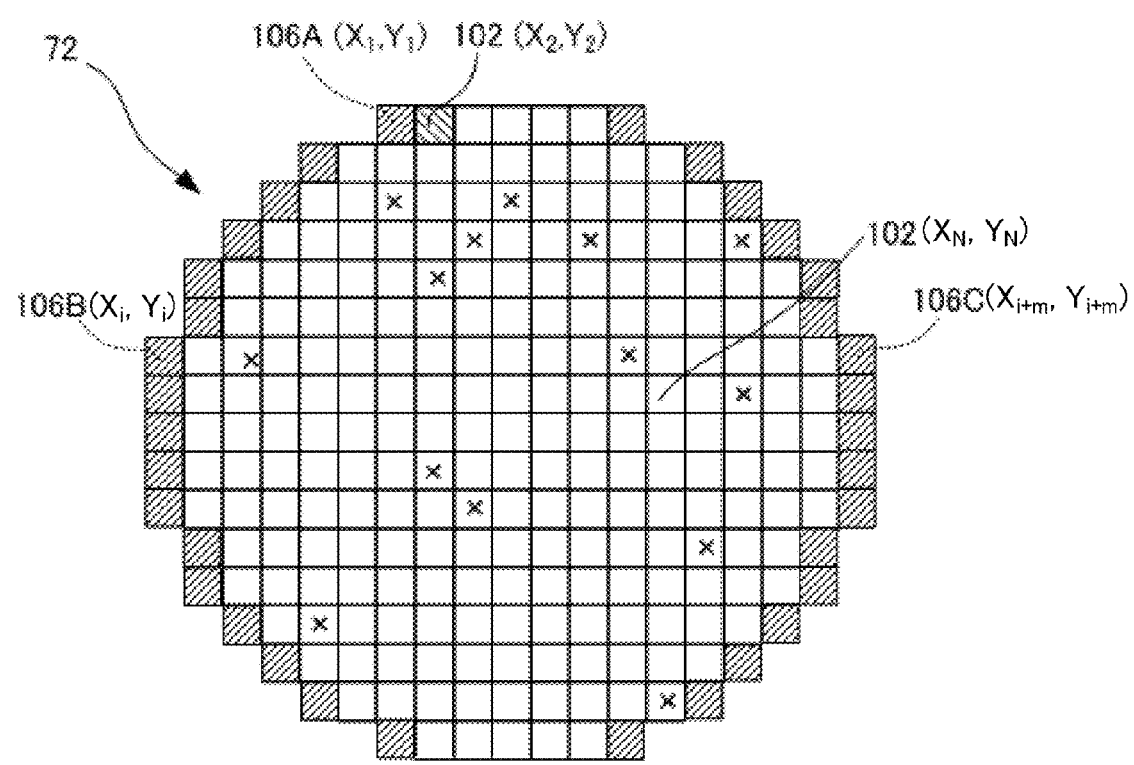
FIG. 9B is map data depicting positions of the standard semiconductor elements, non-defective (defect-free) semiconductor elements and defective semiconductor elements according to the location information depicted in FIG. 9A (Example 2)

Then, in the location map forming step 40, as depicted in FIG. 9B, using the standard semiconductor element 106 A $(X_1, Y_1)$ as a base point, map data 72 is obtained, which is collected and formed as location map information indicating whether each of the semiconductor element products 102 positioned in a certain position $(X_N, Y_N)$ of the semiconductor substrate 101 is non-defective (defect-free) or defective. In the map data 72, a point marked with "x" represents an existing position of the semiconductor element product 102 which is defective. At this time, other than the standard semiconductor element 106A, the location information of the standard semiconductor element 106B and the standard semiconductor element 106C are respectively obtained as coordinate data $(X_i, Y_i)$, $(X_{i+m}, Y_{i+m})$, and then registered.

Thus, the superimposition of the semiconductor substrate with the map data 72 can be performed with high precision. That is, when the non-defective (defect-free) semiconductor elements 102 are successively picked up according to the map data 72, the misalignment of the coordinate datum of the standard semiconductor element 106B or 106C with actual position thereof is relatively detected, thereby automatically checking the presence or absence of occurrence of misalignment with high precision. Thus, in the case where misalignment is caused by operation of an equipment, for example, step out of an electric motor, the occurrence of the abnormality can be determined in an earlier step, and it is possible to reduce a risk that a semiconductor device is produced by picking up the defective semiconductor element.

All examples and conditional language recited herein are intended for pedagogical purposes to aid the render in understanding the invention and the concepts contributed by the inventor to furthering the art, and are to be construed as being without limitation to such specifically recited examples and conditions, nor does the organization of such examples in the specification related to a showing of the superiority and inferiority of the invention. Although the embodiments) of the present inventions have been described in detail, it should be understood that the various changes, substitutions, and alterations could be made hereto without departing from the spirit and scope of the invention.

(Method for Producing Semiconductor Device) An example of a method for producing a semiconductor device using a non-defective semiconductor element picked up by the method for sorting and acquiring a non-defective (defect-free) semiconductor element of the embodiment will be described with reference to drawings.

Figure 10:
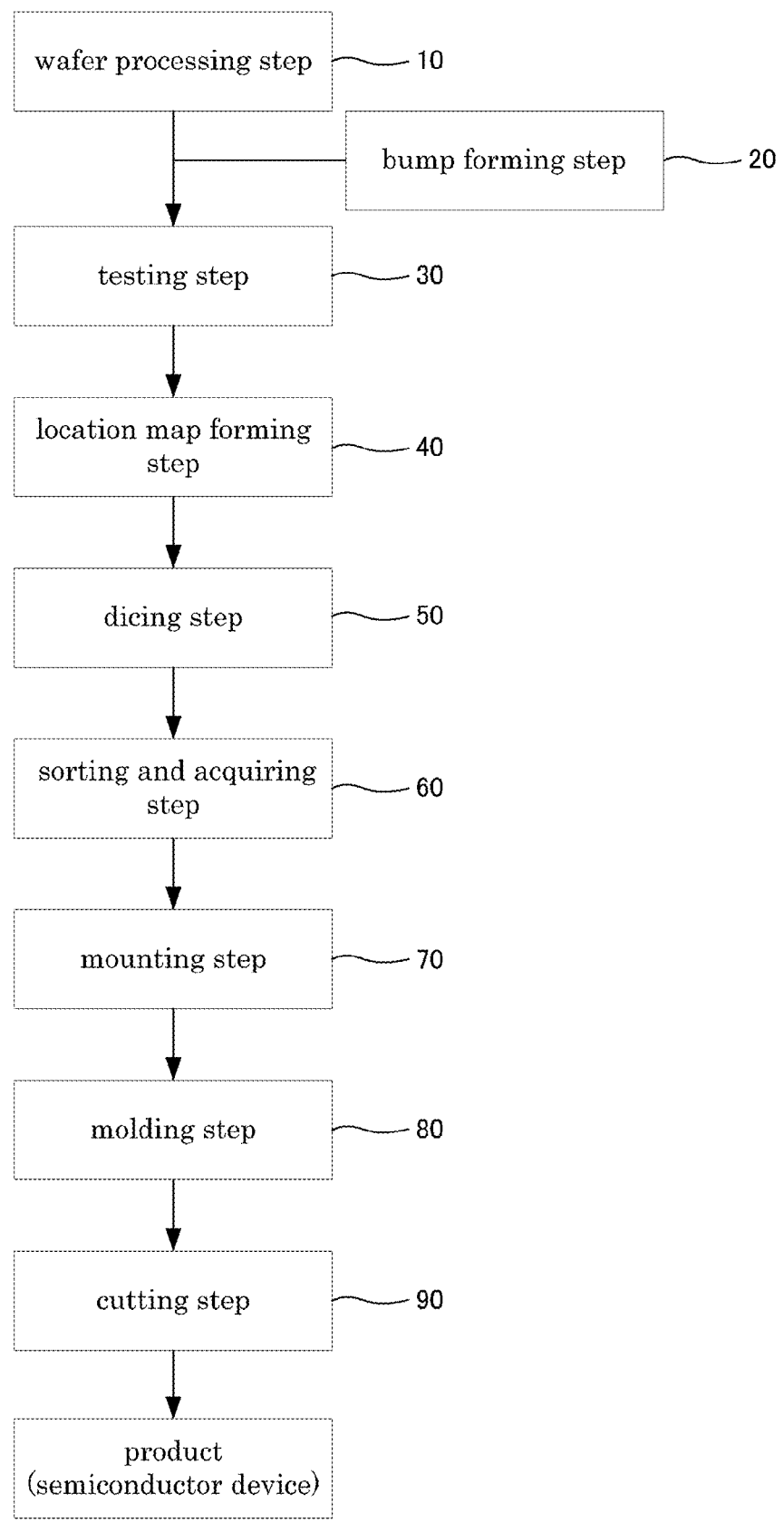
FIG. 10 is a flow chart depicting an example of a method for producing a semiconductor device.

As depicted in FIG. 10, the method for producing a semiconductor device is performed in such a manner that the non-defective semiconductor element (defect-free semiconductor element), which is picked up by performing the step 10 to the step 60 depicted in FIG. 1, is subjected to a step of mounting to a substrate 70, a molding step 80, and a cutting step 90, so as to produce a semiconductor device.

Figure 11A:
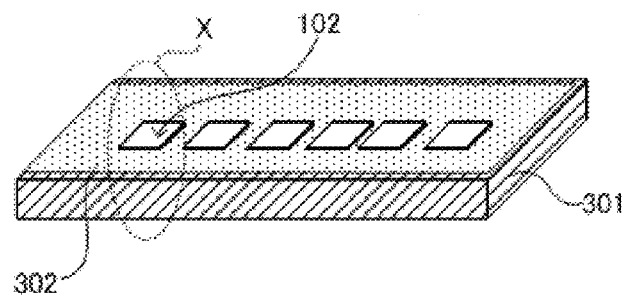
FIG. 11A is a schematic explanatory view depicting an example of a mounting step.

In the step of mounting to a substrate 70, a plurality of non-defective semiconductor elements (defect-free semiconductor elements) 102 are mounted on a surface of a large support substrate (also referred to as an interposer, or a circuit board) 301 in a so-called flip chip (also referred to as face down) manner (see FIG. 11A). On the surface of the supporting substrate 301, electrode terminal pads are provided corresponding to bumps in a plurality of the semiconductor element 102 to be mounted. Moreover, on the surface of the support substrate 301, a so-called underfill material 302 is provided beforehand in some cases. The underfill material 302 can be filled on the surface of the support substrate 301 after the semiconductor element 102 is mounted thereon.

Figure 11B:
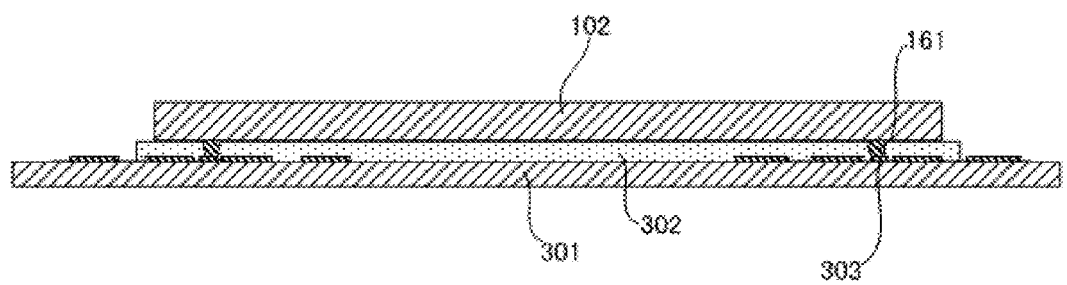
FIG. 11B is an enlarged cross sectional view of an X portion surrounded with a dashed line in FIG. 11A.

FIG. 11B is a state where one semiconductor element 102 is flip-chip-mounted over the surface of the support substrate 301. That is, the bump 161 of the semiconductor element 102 is connected to an electrode terminal pad 303 on the support substrate 301, and the underfill material 302 is filled in between the semiconductor element 102 and the support substrate 301.

Figure 11C:
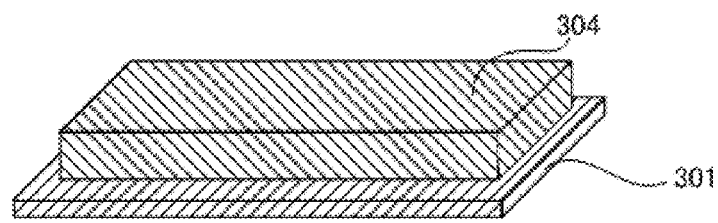
FIG. 11C is a schematic explanatory view depicting an example of a molding step.

Then, in the next molding step 80, the surface of the support substrate 301, on the surface of which a plurality of the non-defective semiconductor elements (defect-free semiconductor elements) 102 are flip-chip-mounted, is resin sealed. As a result, a plurality of the semiconductor elements mounted on the surface of the support substrate 301 are collectively sealed with a sealing resin 304 (see FIG. 11C).

Next, a solder ball as a terminal for external connection is arranged with respect to the electrode pad which is provided corresponding to each of the semiconductor element 102 on another surface of the support substrate 301.

Figure 11D:
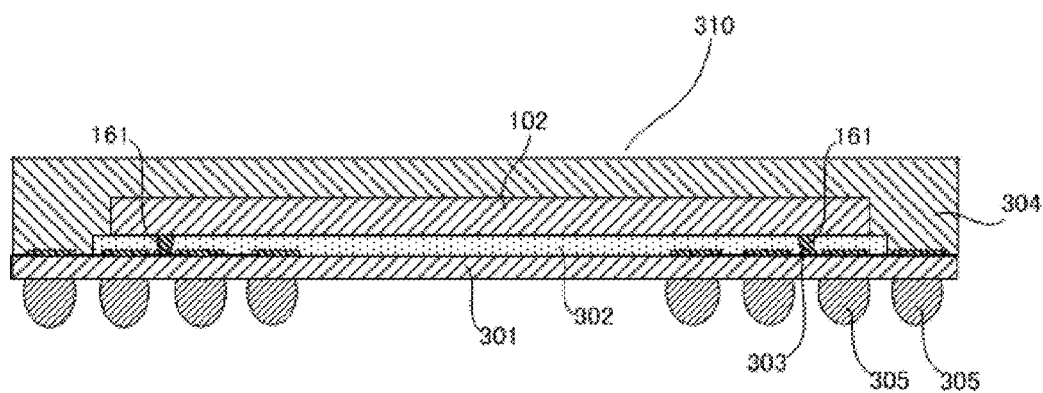
FIG. 11D is a schematic cross sectional view depicting a singulated semiconductor device.
Figure 12A:
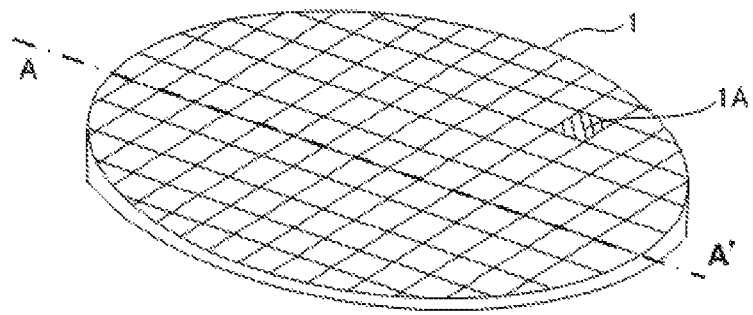
FIG. 12A is a perspective view of a semiconductor substrate including a great number of semiconductor elements in which a great number of bumps are formed.
Figure 12B:
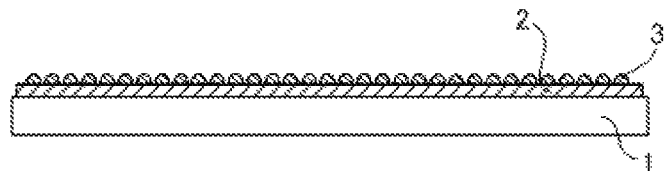
FIG. 12B is a cross sectional view A-A' of FIG. 12A.
Figure 12C:
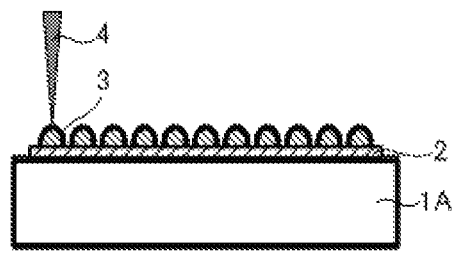
FIG. 12C is a schematic explanatory view depicting a step of a determination test of performance of a great number of the semiconductor elements in the semiconductor substrate.
Figure 12D:
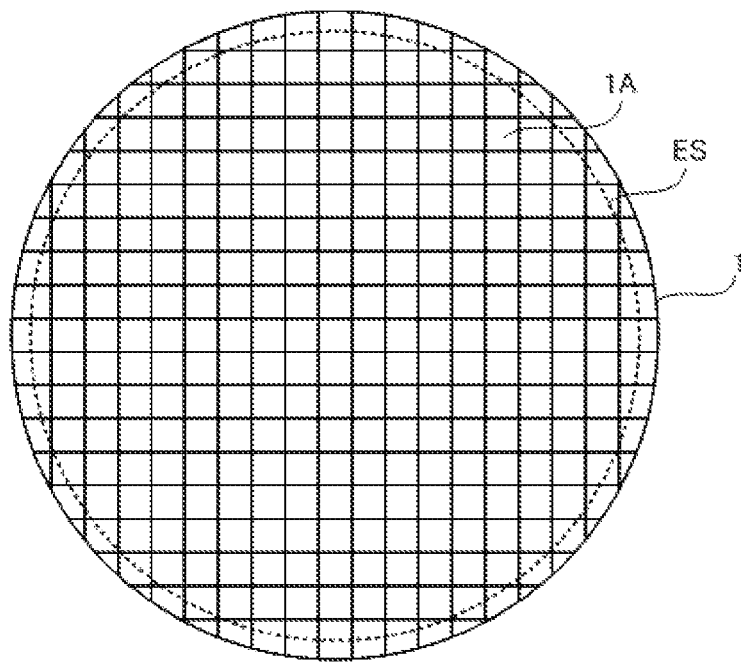
FIG. 12D is a schematic explanatory view depicting positions of the semiconductor elements in the semiconductor substrate.
Figure 12E:
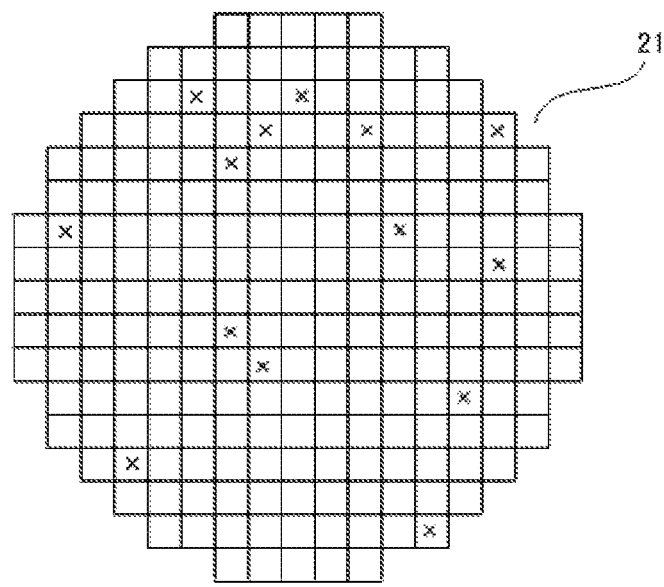
FIG. 12E is conventional map information (map data) depicting positions of defective semiconductor elements and non-defective semiconductor elements according to the location information depicted in FIG. 12D.
Figure 12F:
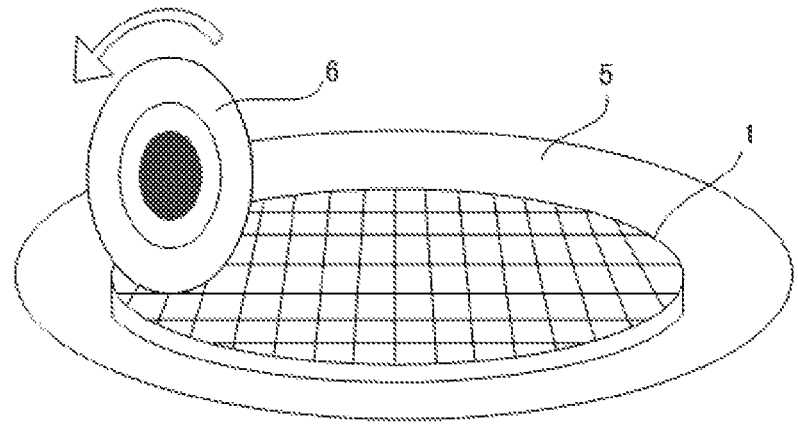
FIG. 12F is a schematic explanatory view depicting an example of a step of dicing the semiconductor substrate in which a great number of the semiconductor elements are formed.
Figure 12G:
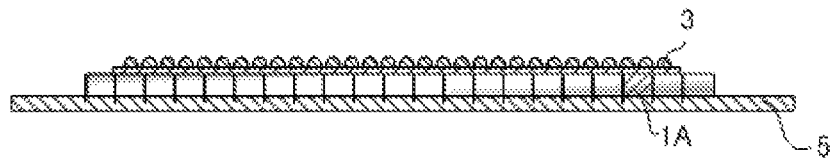
FIG. 12G is a schematic cross sectional view depicting a state in which the semiconductor substrate has been subjected to the dicing step.
Figure 12H:
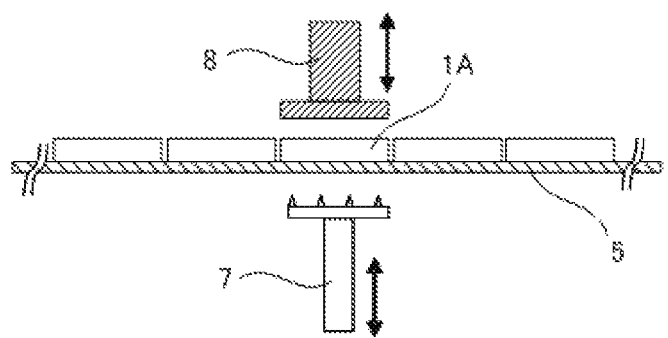
FIG. 12H is a schematic explanatory view depicting an example of a step of acquiring only the non-defective (defect-free) semiconductor elements according to the conventional map data.

Thereafter, in the cutting step 90, a seal resin portion 304 and the support substrate 301 are cut in a lamination direction (thickness direction) so as to obtain a singulated semiconductor device 310 (see FIG. 11D). In the cutting step 90, cutting is performed by a dicing blade. In FIG. 11D, 305 denotes the terminal for external connection formed of the solder resist provided on another surface of the support substrate 301.

According to the method for producing a semiconductor device, the method for sorting and acquiring a defect-free semiconductor element of the invention is used in the sorting and acquiring step 60, so that the defective semiconductor element can be easily picked up when a great number of semiconductor elements are obtained from the semiconductor substrate. Thus, the method for producing a semiconductor device prevents the production of the semiconductor device using the defective semiconductor element and decreases the possibility of producing a defective semiconductor device.

The invention can solve the conventional problems, and provide a method for sorting and acquiring a semiconductor element, which picks up a defect-free (non-defective) semiconductor element from a plurality of semiconductor elements (semiconductor chips) which are formed in a semiconductor substrate (semiconductor wafer), a method for producing a semiconductor device, and a semiconductor device.

A method for sorting and acquiring a semiconductor element of the invention picks up a non-defective (defect-free) semiconductor element from a plurality of semiconductor elements, and is suitably used for efficiently producing a non-defective (defect-free) semiconductor device. The method for producing a semiconductor device of the invention is suitably used for efficiently producing a non-defective (defect-free) semiconductor device, and suitably used for efficiently producing various semiconductor devices.

What is claimed is:

1. A method for sorting and acquiring a semiconductor element, comprising:
   disposing a plurality of semiconductor elements in an effective section in a semiconductor substrate;
   disposing a standard semiconductor element outside of the effective section in the semiconductor substrate;
   forming a bump in each of the plurality of the semiconductor elements and in the standard semiconductor element;
   performing a test on the plurality of the semiconductor elements in the effective section;
   forming a location map using the standard semiconductor element as a base point; and
   picking up the semiconductor elements determined as non-defective in the test from the plurality of the semiconductor elements based on the location map.

2. The method according to claim 1, wherein the performing the test comprises identifying a position of the bump formed in the standard semiconductor element and positions of the bumps formed in each of the semiconductor elements formed in the effective section using an image recognition unit, and forming location information of the semiconductor elements in the effective section using the standard semiconductor element as a standard.

3. The method according to claim 1, further comprising dicing the semiconductor substrate so as to separate the semiconductor elements into single pieces of the semiconductor elements in between the forming the location map and the picking up the semiconductor elements determined as non-defective.

4. The method according to claim 2, wherein the forming the location map is forming the location map including a position of a non-defective semiconductor element and a position of a defective semiconductor element from the location information and a result of the test performed on the plurality of the semiconductor elements in the effective section.

5. A method for producing a semiconductor device, comprising:
   disposing a plurality of semiconductor elements in an effective section in a semiconductor substrate;
   disposing a standard semiconductor element outside of the effective section in the semiconductor substrate;

forming a bump in each of the plurality of the semiconductor elements and in the standard semiconductor element;

performing a test on the plurality of the semiconductor elements in the effective section;

forming a location map using the standard semiconductor element as a base point;

picking up the semiconductor elements determined as non-defective in the test from the plurality of the semiconductor elements based on the location map; and producing a semiconductor device using the semiconductor elements determined as non-defective.

6. The method according to claim 5, wherein the performing the test comprises identifying a position of the bump formed in the standard semiconductor element and positions of the bumps formed in each of the semiconductor elements formed in the effective section using an image recognition unit, and forming location information of the semiconductor elements in the effective section using the standard semiconductor element as a standard.

7. The method according to claim 5, further comprising dicing the semiconductor substrate so as to separate the semiconductor elements into single pieces of the semiconductor elements in between the forming the location map and the picking up the semiconductor elements determined as non-defective.

8. The method according to claim 6, wherein the forming the location map is forming the location map including a position of a non-defective semiconductor element and a position of a defective semiconductor element from the location information and a result of the test performed on the plurality of the semiconductor elements in the effective section.

* * * * *